United States Patent [19]

Paoli et al.

[11] Patent Number: 5,604,149
[45] Date of Patent: Feb. 18, 1997

[54] METHOD OF AND DEVICE FOR ISOLATING ACTIVE AREAS OF A SEMICONDUCOR SUBSTRATE BY QUASI-PLANE SHALLOW TRENCHES

[75] Inventors: Maryse Paoli, Villard-Bonot; Pierre Brouquet, Crolles; Michel Haond, Meylan, all of France

[73] Assignee: France Telecom, Paris, France

[21] Appl. No.: 403,142

[22] Filed: Mar. 13, 1995

[30] Foreign Application Priority Data

Mar. 11, 1994 [FR] France ................................. 94 02871

[51] Int. Cl.$^6$ ................................................. H01L 21/76
[52] U.S. Cl. ................................................. 437/67
[58] Field of Search ........................... 437/69, 70, 72, 437/67, 73

[56] References Cited

U.S. PATENT DOCUMENTS 5,459,096  10/1995  Venkatesan et al. .................. 437/67

FOREIGN PATENT DOCUMENTS

| | | |
|---|---|---|
| 0300569 | 1/1989 | European Pat. Off. . |
| 0396369 | 11/1990 | European Pat. Off. . |
| 407047A3 | 1/1991 | European Pat. Off. . |
| 0424608 | 5/1991 | European Pat. Off. . |
| 0461498 | 12/1991 | European Pat. Off. . |
| 0185043 | 7/1988 | Japan .................................. 437/72 |
| 0307242 | 12/1989 | Japan .................................. 437/72 |
| 2256967 | 12/1992 | United Kingdom . |

OTHER PUBLICATIONS

IEEE Transactions on Electron Devices, vol. ED–34, No. 12, Dec. 1987, New York, US pp. 2450–2455.

*Primary Examiner*—Trung Dang
*Attorney, Agent, or Firm*—Robbins, Berliner & Carson, LLP

[57] ABSTRACT

The semiconductor device comprises in a semiconductor substrate (1) at least one predetermined region (6) of the substrate intended subsequently to form an active area, uncovered on its upper surface and situated between the lateral trenches (7) containing an insulative material including at least one layer of a conformal oxide, the insulative material forming on either side of said uncovered predetermined region of the substrate a boss (16) on the plane upper surface of the device. The height of the boss is less than 1 000 Å and the insulative material can also include planarising oxide.

9 Claims, 4 Drawing Sheets

METHOD OF AND DEVICE FOR ISOLATING ACTIVE AREAS OF A SEMICONDUCOR SUBSTRATE BY QUASI-PLANE SHALLOW TRENCHES

BACKGROUND OF THE INVENTION

1. Field of the Invention

The invention concerns lateral isolation of active areas of a semiconductor substrate by shallow trenches.

2. Description of the Related Art

Lateral isolation techniques are evolving against a background of reducing dimensions and increasing density in the field of microelectronics. The person skilled in the art already knows techniques based on localised oxidation ("LOCOS"). In a technique of this kind, oxide is grown by a thermal process in an opening intended to form the isolating structure. However, the person skilled in the art also knows that a structure of this kind spreads laterally in a so-called "beak" shape causing shrinking of the active area. At present the length of the beak can be reduced by a large number of technical operations. Nevertheless, this technique is subject to limitations which cannot be overcome at present because the technique leads to thinning of the insulative oxide in narrow openings.

The person skilled in the art knows different isolation techniques which consists in filling shallow trenches with an insulative material. The person skilled in the art usually calls this technique the "BOX" technique or "Shallow Trench Isolation (STI)". This technique has been the subject of considerable research and many publications over a number of years and has to date been developed to only a very limited extent because of its technological complexity.

SUMMARY OF THE INVENTION

An object of the invention is to propose a method of isolating active areas by lateral trenches that is easier to implement while ensuring satisfactory flatness of the upper surface of the final device produced by the method, in particular in wide isolating trenches.

Another object of the invention is to propose isolation of active areas of semiconductor substrates by lateral trenches providing good electrical insulation combined with good filling of the trenches, especially in the case of particularly narrow trenches which can have a depth/width ratio greater than 1, with a width in the order of 0.4 µm or even less.

In accordance with one general feature of the method in accordance with the invention of isolating active areas of a semiconductor substrate by means of lateral trenches:

a) trenches are formed in the semiconductor substrate laterally of predetermined regions of the substrate intended subsequently to form said active areas, b) at least one layer of an insulative conformal oxide is deposited in the trenches and on said predetermined regions of the substrate, c) the semiconductor block obtained in step b) is annealed, d) the annealed semiconductor block is partially and selectively etched to leave on either side of each predetermined region of the substrate or on either side of groups of neighbouring predetermined regions of the substrate projecting areas of conformal oxide, e) the conformal oxide layer of the semiconductor block formed in step d) is partially mechanical/chemical polished to reduce the height of the projecting conformal oxide areas below a chosen residual relief height, and f) the active areas of the substrate are uncovered by chemical etching with detection of end of attack on the semiconductor block formed in step e).

In one embodiment of the invention, in step a) the definition of the predetermined regions of the substrate intended subsequently to form the active areas includes the production of a mask and some of the projecting regions are produced using a mask corresponding to the negative of the mask defining the predetermined regions of the substrate. However, some other projecting regions can be produced using a mask enlarged relative to the negative of the mask defining the active areas, especially in the case of active areas that are close together and separated by narrow trenches.

In one embodiment of this method, in step a) an auxiliary layer is deposited on a primary layer of protective oxide or oxynitride before the trenches are formed and end of attack is preferably detected on the auxiliary layer serving as a barrier layer for the etching operation.

The residual relief height that the shaped projecting oxide areas must not exceed after mechanical/chemical polishing is chosen, among other things, so as not to disrupt subsequent photolithography steps prior to completion of the semiconductor component in the substrate. It has been found that a residual height of 1000 Å is an acceptable limit.

Although the invention makes general provision for the use of conformal oxide, it has proven especially advantageous, in step b), to deposit a layered structure in the trenches and on said predetermined regions of the substrate, said structure including a layer of insulative planarising oxide disposed between two layers of conformal oxide. The partial mechanical/chemical polishing of the invention is then effected on the upper layer of conformal oxide of the semiconductor block formed in step d).

The use in accordance with the invention of conformal oxide and planarising oxide fills more easily small voids, typically having a depth/width ratio in the order of 1, and this use of two oxides and in particular of the planarising oxide allows a tolerance in the alignment of the mask on the semiconductor substrate which prevents the subsequent formation of crevasses on either side of the active regions which would cause leakage currents in the finished semiconductor component.

The invention also consists in a semiconductor device including in a semiconductor substrate at least one predetermined region of the substrate intended subsequently to form an active area, uncovered on its upper surface and situated between lateral trenches containing an insulative material including at least one layer of an insulative conformal oxide, the insulative material forming on either side of said uncovered particular region of the substrate a boss on the plane upper surface of the device, the height of this boss being advantageously less than 1000 Å.

In one preferred embodiment of the invention the insulative material includes at least one underlying layer of conformal oxide on top of which is a layer of planarising oxide.

The insulative material can instead include a layered structure with a planarising oxide layer between two conformal oxide layers.

BRIEF DESCRIPTION OF THE DRAWINGS

Other advantages and features of the invention will emerge from a reading of the detailed description of embodiments of the invention given by way of non-limiting example with reference to the appended drawings in which.

DETAILED DESCRIPTION OF THE INVENTION

Figure 1A:
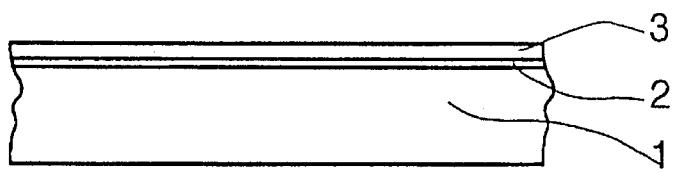
FIGS. 1a through 1i show one embodiment of the method of the invention.
Figure 1B:
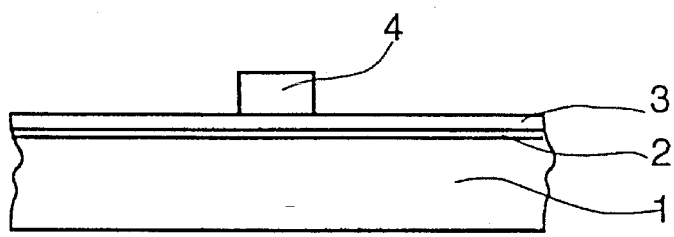

The embodiment of the method of the invention shown in FIGS. 1a through 1h starts with the formation on a semiconductor substrate 1, which can be of silicon, gallium arsenide or silicon on insulator, a primary layer 2 of oxide such as silicon dioxide $SiO_2$ or silicon oxynitride. This primary layer can be grown or deposited and one of its functions is to protect; the substrate 1.

An auxiliary or barrier layer 3 is deposited on the primary oxide layer 2. It is of polycrystalline or amorphous silicon or silicon nitride ($Si_3N_4$), for example. As explained in more detail below, the auxiliary layer 3 advantageously serves as a barrier layer for chemical etching of higher layers, with detection of end of attack. Its thickness is between 500 Å and 2 000 Å, typically 1 000 Å.

As also explained below, the primary oxide layer 2 serves as a barrier layer for the etching of the auxiliary barrier layer 3. The thickness of the primary oxide layer must be sufficient for it to perform the barrier layer function but not too thick as otherwise this will impede the etching operations. A suitable thickness is between 50 Å and 500 Å.

The next step is to define predetermined regions of the substrate which will subsequently form the active areas of the finished semiconductor component. This definition step conventionally entails depositing a resin 4 which is exposed through a mask defining the active areas and then developed to yield the final structure shown in FIG. 1b.

Figure 1C:
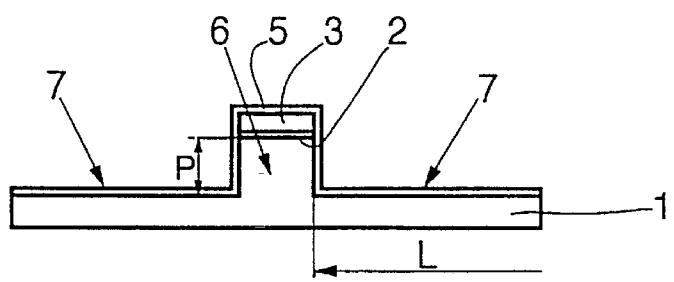

The substrate is then chemically etched on either side of the resin 4 after which the resin is removed and an additional oxide (for example silicon dioxide) layer is grown on the semiconductor block to produce a layer 5 constituting a good interface between the substrate 1 and the future isolating trench 7 and to protect the substrate 1 from impurities. FIG. 1c shows the structure obtained at this stage in the process. The predetermined region 6 of the substrate which will subsequently form the active areas of the semiconductor component has the primary oxide layer 2 and the auxiliary layer 3 on top of it. Thus the trenches 7 are formed on either side of the region. 6 and are covered by the additional layer 5 of silicon dioxide.

The trenches 7 have a lateral dimension or width L and a depth P.

Figure 2A:
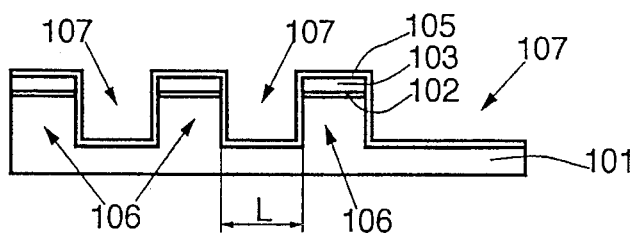
FIGS. 2a through 2f show another embodiment of the method of the invention more particularly intended for close together active areas separated by narrow trenches, and FIGS. 3a and 3b respectively show a region of substrate covered with a conformal oxide layer and with a planarising oxide layer.
Figure 2B:
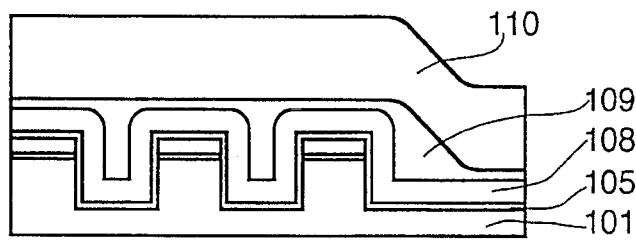

A plurality of predetermined regions which will subsequently form the active areas of one or more semiconductor components are disposed on a semiconductor material wafer. The geometrical configurations of these future active areas can be extremely varied. As shown in FIG. 1c, the active areas can be isolated or widely separated from other active areas by wide isolating trenches; alternatively, as shown in FIG. 2a, groups of active areas 106 can be separated by trenches 107 of greater or lesser width, as appropriate.

The next step of the method of the invention is to deposit an insulative material in the trenches 7 (FIG. 1d) and on the predetermined region of the substrate (the future active area). Although this step can entail depositing a single layer of a "conformal" oxide, using conventional CVD (chemical vapour deposition), for example, it is deemed preferable, in particular for more satisfactory filling of narrow trenches, to deposit an insulative layered structure comprising a layer 9 of a first insulative "planarising" oxide between two layers 8 and 10 of an insulative conformal oxide.

The person skilled in the art knows that a conformal oxide mates with the asperities of a substrate onto which it is deposited while a planarising oxide, which is much more fluid, fills small voids more easily. This difference between two oxides can also be explained in terms of their surface mobility and is shown in FIGS. 3a and 3b in particular.

Figure 3A:
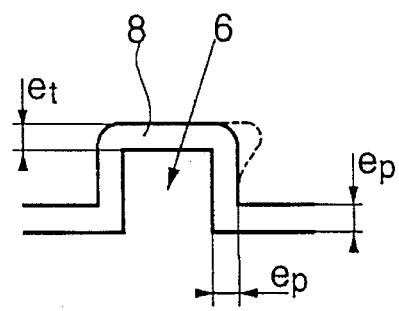

FIG. 3a shows a predetermined substrate region 6 surrounded by trenches and covered by a conformal oxide layer 8. The surface mobility of the conformal oxide is very low (virtually zero), with the result that the thickness $e_p$ of the oxide layer at the bottom of the step formed by the flank of the active area 6 is substantially equal to or even less than the thickness $e_t$ of the layer 8 at the top of the step, which produces voids in the conformal oxide when it is used to fill narrow trenches.

Figure 3B:
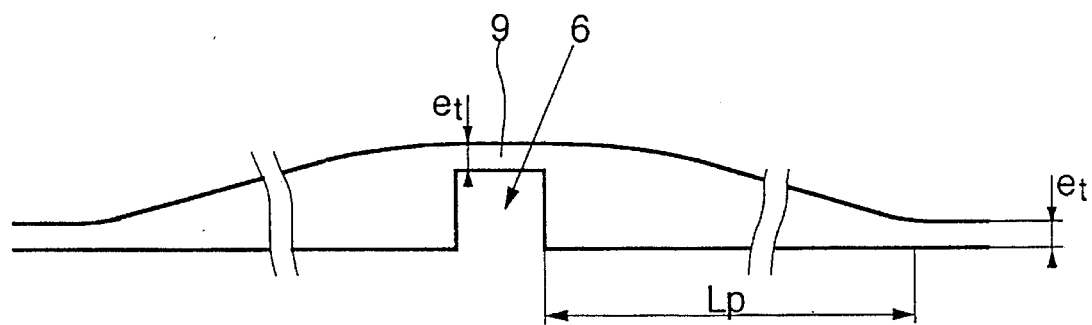

On the other hand, as shown in FIG. 3b in which the same active area 6 has been covered with a planarising oxide layer 9, this latter layer extends with a gentle slope on either side of the active area to revert over a distance to the thickness $e_t$ of the layer as measured at the top of the active area. A ratio $L_p/e_t$ greater than 1 is obtained, where $L_p$ is the distance between the flank of the active area and the location at which the thickness of the layer returns to the value $e_t$. Because of the gentle slope on either side of the active area, a planarising oxide produces a virtually plane oxide layer upper surface which is larger than the upper surface of the active area, which is advantageous when using masks as described in more detail below. The planarising oxide produced by the "Planar 200" machine marketed by the British company ELECTROTECH can be used, for example. With this planarising oxide the ratio $L_p/e_t$ obtained is in the order of 10.

The planarising oxide and the conformal oxide can be distinguished within a layered structure by cleaving the structure at an isolated active area, or even an active area relatively far from another area, and then chemically revealing the layers using a chemical solution well known to the person skilled in the art and based on hydrofluoric acid, for example, selectively etching the various layers of the layered structure, and finally using a scanning electron microscope to measure the respective thicknesses of the various layers at the bottom and at the top of the step.

With narrow trenches (having a width in the order of 0.4 µm or even less), use of conformal oxide alone could produce a P/L ratio close to 1 and lead to the formation of voids in the isolating trenches, but using planarising oxide on top of the first conformal oxide layer fills these small voids satisfactorily.

The thickness of the first conformal oxide layer 8 is advantageously between ¼ and ⅓, and preferably ⅓, the minimal width of the trenches formed on the semiconductor wafer as a whole. This layer 8 provides virtually all of the required electrical isolation function.

The second conformal oxide layer produces a virtually flat top on the layered structure deposited into the wide trenches and which features declivities after deposition of the planarising oxide due to this oxide flowing over these large surfaces.

The conformal and planarising oxides are of the same kind, for example silicon dioxide. The planarising oxide is preferably deposited using the ELECTROTECH Planar 200 machine, for example. The conformal oxide can be deposited by conventional chemical vapour deposition (CVD).

The thickness of the planarising oxide layer is chosen so that minimal width trenches on the wafer are perfectly filled, meaning a variation in relief of less than 200 Å. A planarising oxide layer thickness between 1 000 Å and 2 000 Å is considered satisfactory for trench widths around 0.4 µm.

The thickness of the second conformal oxide layer 10 is greater than the sum of the thickness of the barrier layer 3 and the depth of the trench. The thickness of the layer 1 is made 10% greater than said sum, to cover variations in subsequent etching processes.

The final stage of the process is to anneal the semiconductor block obtained at a temperature of at least 900° C. Well known to the person skilled in the art, this annealing homogenises the deposited oxide layers, which is particularly advantageous for subsequent etching operations. Although annealing is sufficient to obtain satisfactory electrical insulation in the final semiconductor component(s), it is preferable to carry it out at a temperature in the order of 1 050° as this optimises the electrical insulation of the final component(s).

Figure 1D:
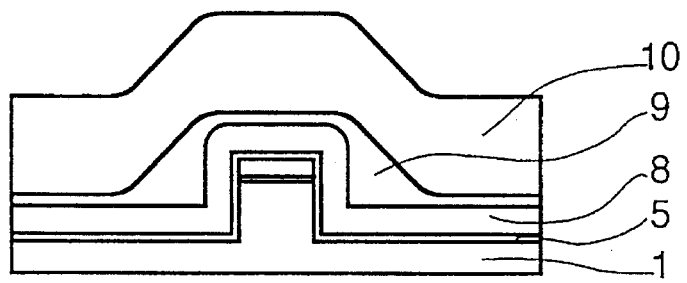

FIGS. 1e through 1i show the step of planarising the semiconductor block shown in FIG. 1d.

This planarising step includes partial selective etching of the semiconductor block shown in FIG. 1d to leave on each side of each predetermined region of the substrate projecting areas 13 of conformal oxide, followed by partial mechanical/chemical polishing of the top layer of conformal oxide of the etched semiconductor block in order to reduce the height of the projecting conformal oxide areas 13 so that they are below a chosen residual relief height, followed by uncovering the predetermined region 6 of the substrate by chemical etching with detection of end of attack on the semiconductor block that has been mechanically/chemically polished.

This planarising step is described for the preferred case of a layered insulative conformal oxide/planarising oxide/conformal oxide structure. It naturally applies to the general case of a single conformal oxide layer of chosen thickness, and the advantages of the partial mechanical/chemical polishing described below apply equally to this general case.

Figure 1E:
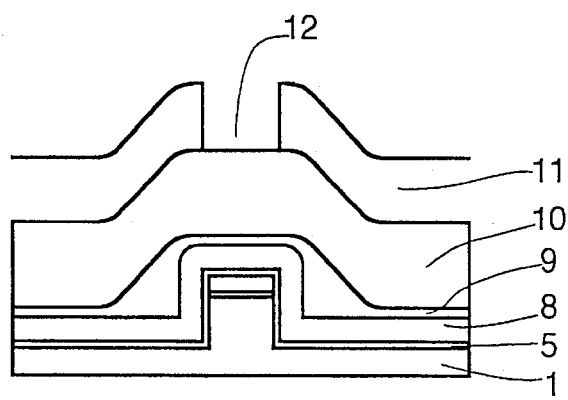

The projecting regions 13 are defined by a mask corresponding to the negative of the mask defining the active area 6. The use of this mask is part of a conventional photolithography step using a resin deposited onto the upper surface of the second conformal oxide layer 10. After exposure through the mask and development of the resin, the latter features a cavity aligned with the active area 6 (FIG. 1e).

Note that the combined use of planarising oxide and conformal oxide produces on the upper surface of the second conformal oxide layer, on top of the active area 6, a plane surface portion sufficient to enable correct alignment of the mask with the edges of the active area of the substrate, allowing for alignment tolerances. This prevents the subsequent formation of small cavities on either side of the active area 6 of the substrate which would otherwise be produced by subsequent chemical etching on too narrow a portion of surface.

The conformal oxide layer 10 is then etched for a fixed time to remove a thickness of oxide equal to the sum of the thickness of the auxiliary layer 3 and the depth P of the trench. The resin 11 is then removed to obtain the structure shown in FIG. 1f. The upper cavity 20 in the block formed in this way is delimited laterally by the steep walls of the projecting points 13. The bottom wall of the cavity 20 is substantially at the same level as the upper surface of the block outside the points 13. The points 13 are relatively narrow at the bottom, where their width is between 0.5 µm and 1 µm, typically 0.5 µm.

Figure 1F:
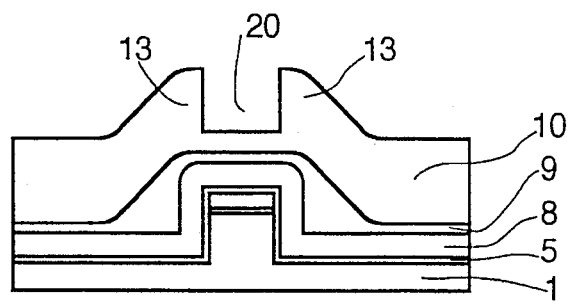
Figure 1G:
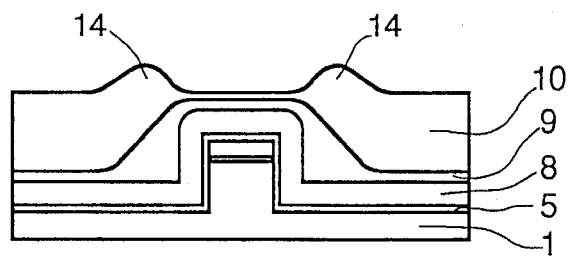
Figure 1H:
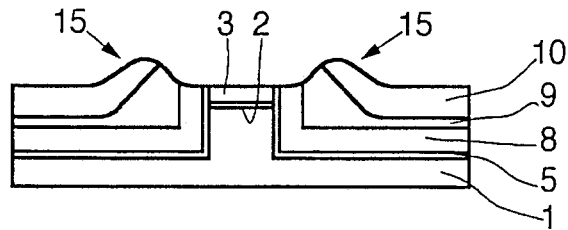

The semiconductor block shown in FIG. 1f is then partly mechanically/chemically polished to round off the projecting points 13. This polishing is carried out until the residual relief heights of the bosses 14 are typically less than 1 000 Å. This upper limit of 1 000 Å has been chosen to prevent problems in subsequent photolithography steps carried out on the device finally obtained by the method of the invention (FIG. 1i) to produce the finished components.

This mechanical/chemical polishing is partial in the sense that it is carried out for a period such that residual bosses rein. It has the advantage of essentially mechanical polishing of the projecting regions avoiding essentially chemical etching of large insulative areas on either side of the projecting regions. This prevents chemical excavation of these large insulative areas which could otherwise result in depressions in the plane upper surface of the semiconductor device finally obtained using the method of the invention and shown in FIG. 1i. Also, the process of the invention allows moderate use of mechanical/chemical polishing, which is a particularly difficult operation. In practice it has proved possible to obtain rounded bosses with a residual relief height of 200 Å.

The next step is chemical etching, preferably plasma etching, with detection of end of attack on the barrier layer 3. To this end the barrier layer 3 must resist plasma etching and must therefore be made of a material such that the ratio of the rate of etching the additional layer 5 of silicon dioxide to the rate of etching the material of the barrier layer is not less than ten.

Figure 1I:
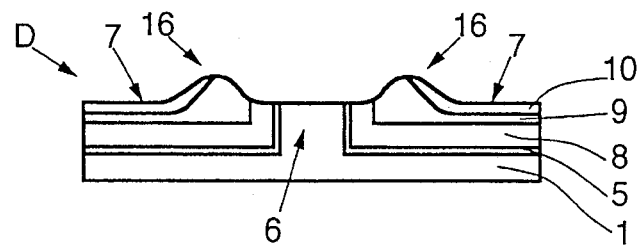

The barrier layer 3 is then etched away, for example by reactive ion etching (RIE), after which the oxide is removed from the predetermined region 6 of the substrate to obtain the final device shown in FIG. 1i. This device D therefore has the predetermined substrate region 6 uncovered on its upper surface. This region 6 will subsequently (e.g. after ion implantation) form the future active area of a semiconductor component. This future active area 6 is isolated from other active areas of the substrate by trenches 7 which in this embodiment contain a layered structure of conformal oxide 8, planarising oxide 9 and conformal oxide 10. The insulative material of the trench forms on either side of the uncovered predetermined substrate region 6 a boss 16 on the plane upper surface of the device D. The height of this boss is less than 1 000 Å which means that it will not impede any subsequent photolithography steps.

The embodiment of the method of the invention just described is more particularly intended for isolated active areas, and even for active areas relatively far away from other active areas. Nevertheless, the same semiconductor substrate wafer can carry various configurations of active areas with different geometrical shapes and in particular active areas 106 separated by narrow trenches 107 having widths L of 0.5 µm, for example (FIG. 2a). FIGS. 2a through 2f show an embodiment of the method of the invention which is more particularly applicable to close together active areas like these. In these figures, parts analogous to or having analogous functions to those shown in FIGS. 1a through 1i have the same reference numbers increased by 100 relative to those used in the latter figures. Only the differences between FIGS. 1a through 1i and FIGS. 2a through 2f are described.

Figure 2C:
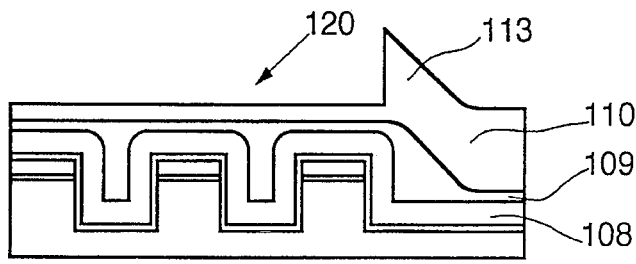
Figure 2D:
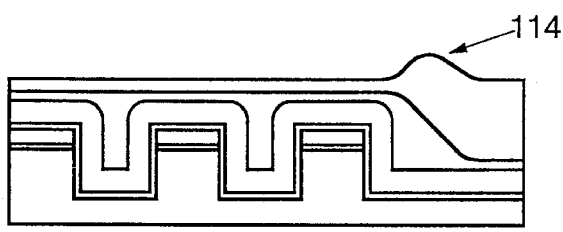
Figure 2E:
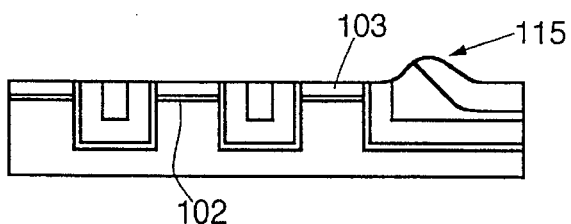

If the variations in relief measured on the upper conformal oxide layer 110 (FIG. 2b) and resulting from the filling of the narrow trenches 107 is below a predetermined limit in the order of 200 Å the narrow trenches are deemed to be perfectly filled. In this case it is not necessary to mask each narrow trench individually. The mask is then widened relative to the mask defining the active areas in order to generate the projecting points 113 on either side of the group of future active areas 106 separated by the narrow trenches. For simplicity FIG. 2c shows only one of these projecting points 113.

Figure 2F:
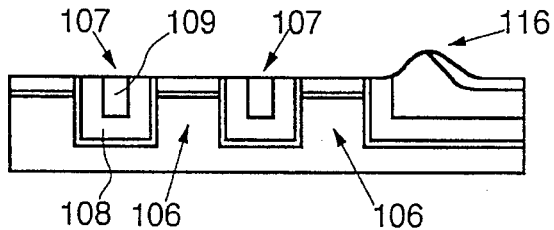

The subsequent steps of the method are identical and yield the final structure of the device D shown in FIG. 2f. The second conformal oxide layer has been completely removed in the narrow trenches 107 where there remains only one conformal oxide layer 108 under the planarising oxide layer 109.

We claim:

1. Method of isolating active areas of a semiconductor substrate with lateral trenches characterised in that:
    a) trenches (7) are formed in the semiconductor substrate (1) laterally of predetermined regions (6) of the substrate intended subsequently to form said active areas (6),
    b) at least one layer (8) of an insulative conformal oxide is deposited in the trenches (7) and on said predetermined regions (6) of the substrate,
    c) the semiconductor block obtained in step b) is annealed, and
    d) the annealed semiconductor block is partially and selectively etched to leave on either side of each predetermined region (6) of the substrate or on either side of groups of neighbouring predetermined regions (106) of the substrate projecting areas of conformal oxide (13, 113),
    e) the conformal oxide layer (10, 110) of the semiconductor block formed in step d) is partially mechanical/chemical polished to reduce the height of the projecting conformal oxide areas below a chosen residual relief height,
    f) the predetermined regions (6, 106) of the substrate are uncovered by chemical etching with detection of end of attack on the semiconductor block formed in step e).

2. Method according to claim 1 characterised in that in step a) the definition of the predetermined regions (6) of the substrate includes the production of a mask and some of the projecting regions (13) are produced using a mask corresponding to the negative of the mask defining the predetermined regions (6) of the substrate.

3. Method according to claim 1 characterised in that it in step a) the definition of the predetermined regions (106) of the substrate includes the production of a mask and some of the projecting regions (113) are produced using a mask enlarged relative to the negative of the mask defining the predetermined regions (106) of the substrate.

4. Method according to claim 1 characterised in that in step a) an auxiliary layer (3) is deposited on a primary insulative layer before the trenches (7) are formed and in that end of attack is detected on the auxiliary layer serving as a barrier layer for the etching operation.

5. Method according to claim 1 characterised in that the residual relief height is in the order of 1 000 Å.

6. Method according to claim 1 characterised in that the chemical etching with end of attack detection is plasma etching.

7. Method according to claim 4 characterised in that step a) includes the formation on the semiconductor substrate of a primary oxide layer (2) before deposition of the auxiliary layer (3) and in that in step d) the auxiliary layer (3) and the primary layer (2) are removed after chemical etching.

8. Method according to claim 1 characterised in that the annealing is effected at a temperature in the order of 1 050° C.

9. Method according to any one of the preceding claims characterised in that in step b) a layered structure is deposited in the trenches (7) and on said predetermined regions (6) of the substrate, said structure including a layer (9) of insulative planarising oxide disposed between two layers (8, 10) of insulative conformal oxide and in that in step e) the partial mechanical/chemical polishing is effected on the upper layer of conformal oxide.

* * * * *